Figure 1:
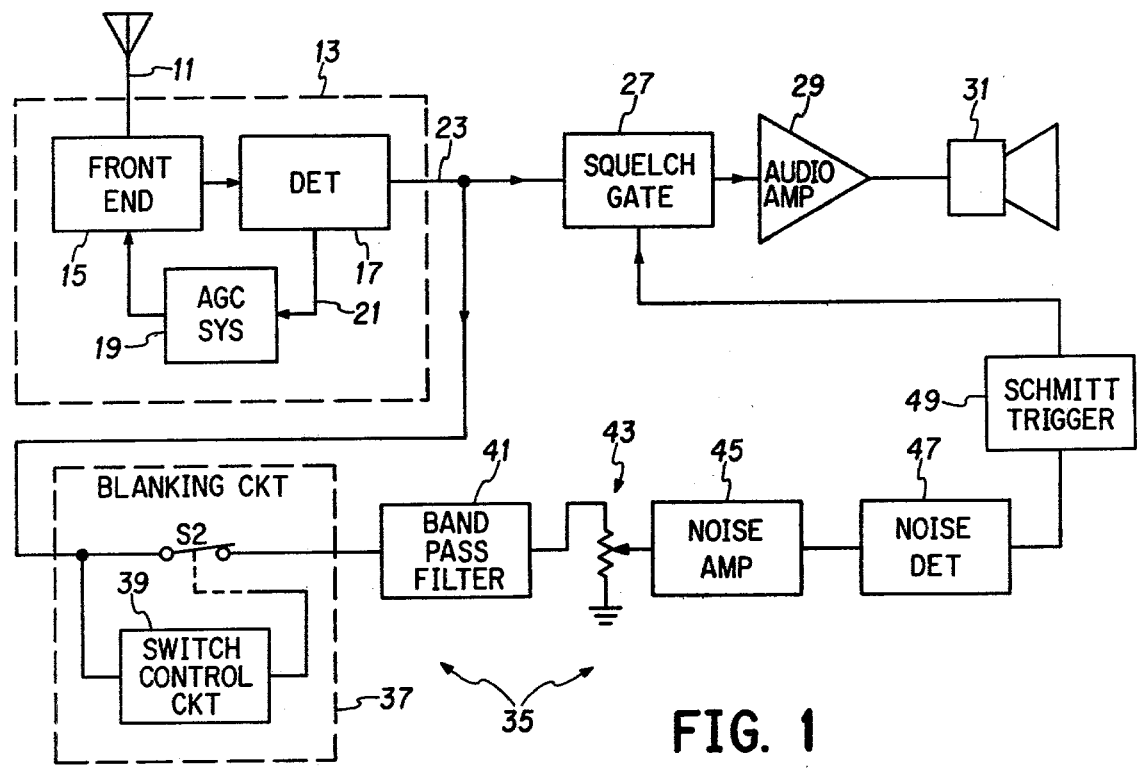

United States Patent [19]

Beningfield et al.

[11] 4,203,072
[45] May 13, 1980

[54] REDUCTION OF IMPULSE NOISE CONTRIBUTION TO RECEIVER SQUELCH THRESHOLD

[75] Inventors: Harley W. Beningfield, Satellite Beach; Ward L. Sparks, Indian Harbour Beach, both of Fla.

[73] Assignee: Rockwell International Corporation, El Segundo, Calif.

[21] Appl. No.: 905,668

[22] Filed: May 15, 1978

[51] Int. Cl.² ............................................. H04B 1/10
[52] U.S. Cl. ................................... 455/223; 455/312
[58] Field of Search ............... 325/313, 348, 478–480, 325/402; 328/162, 165

[56] References Cited

U.S. PATENT DOCUMENTS

| | | | |
|---|---|---|---|
| 3,011,052 | 11/1961 | Busby | 325/478 |
| 3,140,446 | 7/1964 | Myers et al. | 325/478 |
| 3,191,124 | 6/1965 | Brown | 325/478 |
| 3,568,068 | 3/1971 | Russell, Jr. | 325/348 |
| 3,699,457 | 10/1972 | Wright | 325/478 |
| 3,810,023 | 5/1974 | Crowley et al. | 325/478 |
| 3,934,206 | 1/1976 | Holecek | 325/478 |

Primary Examiner—Robert L. Griffin
Assistant Examiner—Jin F. Ng
Attorney, Agent, or Firm—Terry M. Blackwood; Richard A. Bachand; H. Frederick Hamann

[57] ABSTRACT

A receiver includes demodulator, squelch gating and squelch circuit for controlling the gating. A blanking circuit, responsive to impulse type noise, prevents impulse noise energy from contributing to the control of the gating.

9 Claims, 2 Drawing Figures

REDUCTION OF IMPULSE NOISE CONTRIBUTION TO RECEIVER SQUELCH THRESHOLD

This invention relates to receivers and in particular to squelch systems.

Squelch systems are commonly employed in VHF and UHF receivers to suppress noise when little or no signal is being received. More particularly, intelligence processing circuits, typically audio circuits, are turned on or off in accordance with excursions of a squelch drive signal across a threshold level. Several types of squelch systems are known. See for example U.S. Pat. Nos. 2,343,115 and 3,188,571.

A commonly employed squelch principle is popularly known as noise squelch. In receivers employing the noise squelch type of system, a bandpass or highpass filter following the receiver detector attenuates the lower intelligence bearing frequencies (e.g., the voice frequencies) and outputs the higher frequencies (generally just noise) to a rectifier and threshold discriminator circuit. Due to AGC action in the receiver front end, the noise power increases as the desired signal or intelligence decreases, and at some level the discriminator trips and turns off the receiver audio channel so as to prevent the transmission therethrough of the energy which is principally noise energy. Likewise due to the AGC action, as the desired signal increases, noise power decreases, and at some level the discriminator trips and turns the receiver audio channel on.

In signal environments wherein the desired signals are relatively low level and wherein the noise includes impulse noise components (such as ignition noise) receivers with such squelch systems may not perform satisfactorily. More particularly, our investigation has revealed that impulse type noise such as ignition noise can and will raise squelch threshold level to such an extent that desired signals will not break squelch. Accordingly, the present invention features reduction, to the point of virtual exclusion, of impulse type noise contribution to the squelch threshold.

Figure 2:
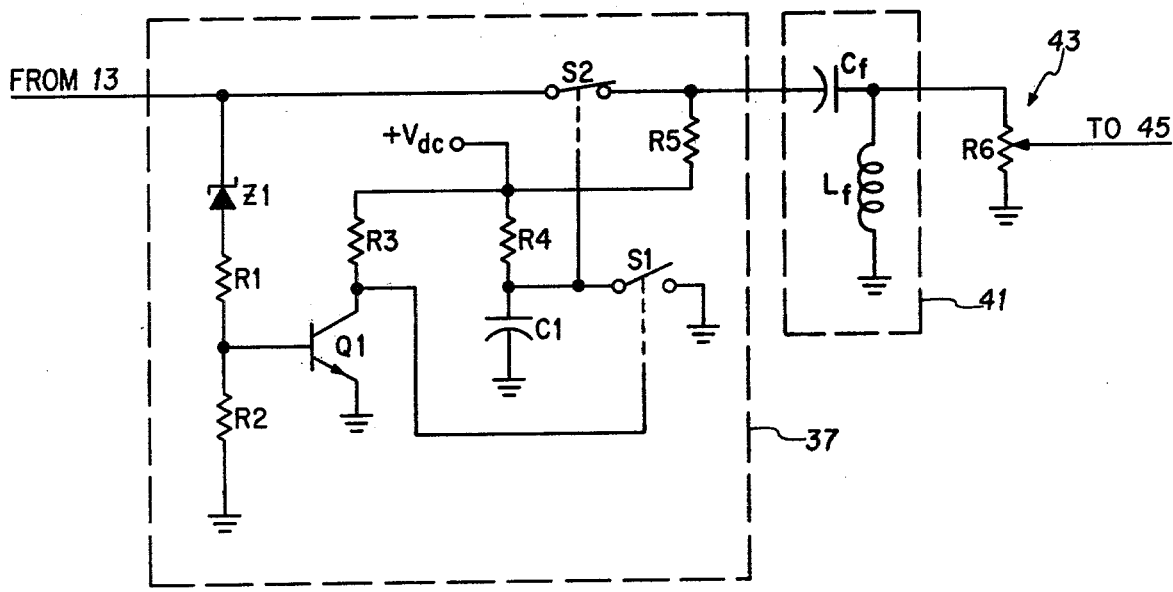

These and other features, objects, and advantages of the invention will become more apparent upon reference to the following specification, claims, and appended drawings in which:

FIG. 1 is a block diagram schematic representing a receiving system including the presently preferred inventive embodiment; and FIG. 2 is a schematic diagram showing in more detail a portion of the FIG. 1 apparatus.

A receiver incorporating the principles of the present invention, and in addition representing the presently preferred embodiment is shown in FIG. 1. Since the embodiment bears many similarities to a receiver described in the aforementioned U.S. Pat. No. 3,188,571 assigned to the assignee hereof, the following description will set forth only a brief summary of the well known and understood receiver portions.

Briefly, then, an incoming signal 11 is fed through signal demodulator means 13 including a receiver front end 15 and a detector 17. An AGC system 19 employs part of detector output signal 21 to derive a feedback signal to control the gain of an amplifier or amplifiers in front end 15. Front end 15 preferably comprises an RF amplifier, a mixer, an oscillator and an IF amplifier. The detector 17 is usually a class C type AM detector. Other choices, appropriate for the type of signal being received, will be apparent to those skilled in the art; what is important is that the demodulator recover the intelligence originally impressed on the RF carrier.

In the preferred embodiment, the recovered intelligence is an audio frequency waveform and the demodulator output 23 is connected to an audio channel containing gating means 27, audio amplifier 29, and a speaker or headset 31. Gating means 27 preferably comprises a diode switch in series with the audio channel which is switched to its off mode by the application of an appropriate control voltage and prevents transmission of the audio to amplifier 29 and speaker 31. Alternatively, the switch may be an integral part of audio amplifier 29 such that the off mode is achieved by using a control voltage of appropriate polarity to remove bias current from audio output transistors. Other satisfactory gating circuits will be apparent to those skilled in the art.

Connected between the demodulator output 23 and the squelch gate 27 is squelch circuit 35. In accordance with the present invention, a blanking circuit 37, shown in FIG. 1 as receiving the demodulator output 23, prevents impulse noise from contributing to the development of the squelch control signal. That is, the squelch control signal is substantially independent of impulse type noise energy. As will be seen from more detailed description hereinbelow in conjunction with FIG. 2, blanking circuit 37 basically comprises a switch S2 and a switch control circuit 39. Circuit 39 is essentially a threshold detector which effects a blanking state of switch S2 depending on the amplitude of the input to circuit 39.

Following blanking circuit 37 in the squelch circuit is bandpass filter 41, potentiometer 43, noise amplifier 45, noise detector 47, and Schmitt trigger 49. The bandpass of filter 41 is centered at 9 kHz. Potentiometer 43 serves as a squelch threshold level adjustment means. Noise amplifier 45 presently comprises a FET whose drain circuit is also tuned to 9 kHz. Noise detector 47 converts noise received from noise amplifier 45 to a dc voltage useful for operating Schmitt trigger 49 for control of gate circuit 27. Noise detector 47 comprises a rectifier, configured as a conventional voltage doubler, followed by a dc amplifier which increases the rectifier output to properly drive the Schmitt trigger 49.

The presently preferred embodiment of blanking circuit 37 is shown in more detail in FIG. 2. In operation, and absent impulse type noise, the dc level at demodulator output 23 is held at about seven volts by the AGC. Under such conditions zener diode Z1 conducts, transistor Q1 is on and the Q1 collector voltage is low. With Q1 collector voltage low, switch S1 is open, the control lead of S2 is high (due to voltage applied through resistor R4), and switch S2 is closed. With S2 closed, the demodulator 13 output passes on to filter 41, amplifier 45, and the other squelch control signal developing elements.

With modulation up to but not exceeding about 100%, the demodulator output voltage is always high enough to keep transistor Q1 conducting and switch S2 closed. However, ignition noise pulses are negative going at the demodulator output 23 and generally exceed the level of 100% modulation. Thus, during an ignition impulse, the demodulator 13 output voltage drops low enough such that Q1 stops conducting. The Q1 collector voltage thus rises and closes switch S1 which thereby grounds the S2 control lead and causes S2 to open. When S2 is open, practically no energy at all reaches the succeeding squelch circuit elements.

When the ignition pulse ceases, Q1 again conducts and causes S1 to reopen. With the control lead of S2 no longer grounded, C1 begins charging through resistor R4. After C1, and thus the S2 control lead, charges to a predetermined voltage, S2 again closes and reestablishes normal squelch operation.

Although not essential, this short delay in reclosing S2 after the impulse has ceased and S1 has reopened is presently employed and preferred because said delay at least partially compensates for the energy allowed to pass through a closed S2 while the impulse is increasing but before it is great enough to activate the blanker and open S2. In the FIG. 2 embodiment, S2 opens when the impulse causes the input to fall from about 7 volts to about 5 volts and recloses approximately 150 microseconds after the noise impulse trailing edge has permitted the demodulator 13 output voltage to rise back to the 5 volt level.

Noise detector 47, similar to standard AM detectors, of course includes sufficient low pass or integrating characteristic to prevent these abbreviated interruptions in energy supply from causing Schmitt trigger 49 to remove the muting.

Resistor R5, also not essential, is presently employed and preferred since it provides a discharge or equalization path for any charge on $C_f$ during the periods when S2 is open.

Bandpass filter 41 is series resonant at about 9 kHz, the voltage across inductance $L_f$ being greatest at said resonant frequency. Noise amplifier 45 includes a parallel "LC" filter circuit in its drain circuit such that the overall bandpass in the squelch circuit is relatively narrow. More particularly, the overall bandpass 6 dB points occur approximately at 9 kHz±3 kHz.

Other details for the FIG. 2 apparatus are as follows: S1 and S2 are each one quarter of a 4016 quad bilateral switch; Q1 is a 2N2222; Z1 is a 3.3 volt zener diode; $V_{dc}$ is +9.5 volts; R1, R2, R3, R4, and R5 are, respectively, 100 Kohms, 33 Kohms, 100 Kohms, 56 Kohms, and 100 Kohms; C1 and $C_f$ are respectively 0.005 μf and 2200 pf; $L_f$ is 100 mh; R6 is a 100 Kohm pot.

It will be apparent to those skilled in the art that numerous and varied modifications in addition to those hereinabove suggested may be made without departing from the inventive principles herein. For instance, highpass filtering can be substituted for bandpass filtering. Also, such highpass filtering may precede the blanking circuit. The switch control circuit could be embodied for instance as an op-amp comparator circuit. For some types of impulse noise a differentiator circuit for triggering Q1 could anticipate the impulse and help speed up the opening of S2. Also for types of systems wherein impulse noise could present both positive going and negative going spikes, a control circuit sensitive to either could be useful.

Of course the principles are applicable to squelch systems other than noise squelch systems. For example, in the signal-plus-noise to noise squelch systems which operate on a fixed ratio of audio signal to noise at the receiver demodulator output, noise blanking similar to that hereinabove could be used in the noise level developing circuits.

Thus while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. A radio receiver comprising:
   demodulator first means;
   second means connected to said first means for processing the intelligence of the first means output, and having gating third means;
   fourth means which at least some of the time is connected for receiving noise energy from said first means, said fourth means for developing a control signal which is dependent upon the noise energy received by said fourth means and which is for controlling said third means; and
   fifth means connected for receiving noise energy from said first means, said fifth means for temporarily preventing from entering said fourth means substantially any and all the noise energy available from said first means, the temporary prevention occurring after the amplitude of the noise received by said fifth means crosses a predetermined threshold level $L_1$.

2. A receiver as defined in claim 1 wherein said fifth means is additionally for reestablishing noise energy entry to said fourth means a predetermined time $T_\delta$ after said noise amplitude subsides to a predetermined level $L_2$.

3. A radio receiver comprising:
   demodulator means wherein intelligence and noise energy may be present; means connected to said demodulator means for processing the intelligence of the demodulator means output, and having gating means; and circuit means, connected to said demodulator means, for developing a control signal which is dependent upon at least some of the noise energy in said demodulator means and which is for controlling said gating means, said circuit means including blanking means, connected for receiving noise energy from said demodulator means, for controllably interrupting noise energy flow in said circuit means so as to make said control signal substantially independent of impulse noise components of the noise energy.

4. A receiver as defined in claim 3 wherein said blanking means comprises switch means and switch control means for effecting a blanking state of said switch means when the amplitude of the noise received by said blanking means crosses a predetermined threshold level $L_x$.

5. A receiver as defined in claim 3 wherein said blanking means comprises switch means and switch control means for (i) effecting a blanking state of said switch means when the amplitude of the noise received by said blanking means crosses a predetermined threshold level $L_x$ and (ii) removing said blanking state a predetermined time after said noise amplitude subsides to a predetermined level $L_y$.

6. For use with a receiver including demodulator means and demodulator means output intelligence processing means having gating means, squelch means comprising:
   first means, connected to said demodulator means, for developing a control signal which is dependent on at least some noise energy in the demodulator means and which is for controlling said gating means; and second means, connected to said demodulator means and responsive to the amplitude of noise therein, for preventing noise energy from contributing to the development of said control signal during controlled intervals each extending at least for the time where the noise amplitude exceeds a predetermined level.

7. Apparatus as defined in claim 6 wherein said controlled intervals each extend at least for the time where the noise amplitude exceeds a predetermined level plus for a predetermined non-zero time thereafter.

8. In a radio receiver of the type including (i) a path for recovering intelligence from a received signal, said path also possibly carrying noise energy, (ii) gating means connected within said intelligence recovering path, (iii) and squelch circuit means, connected to said intelligence recovering path, for (a) receiving at least some of the noise energy thereon and (b) developing a control signal which is dependent on noise energy and which is for controlling said gating means, the improvement comprising:

blanking means, responsive to said noise energy on said intelligence recovering path, for controlling reception by said squelch circuit means of noise energy so as to make said control signal substantially independent of impulse noise components of the noise energy.

9. The radio receiver as defined in claim 8 wherein said blanking means comprises controllable interruption first means connected for interrupting the reception by said squelch circuit means of noise energy, and second means, connected to said intelligence recovering path and responsive to impulse noise energy thereon, for effecting temporary interruption by said first means upon the occurrence of impulse type noise energy.

* * * * *